(12) United States Patent
Habu

(10) Patent No.: US 9,648,719 B2
(45) Date of Patent: May 9, 2017

(54) HIGH-FREQUENCY POWER SUPPLY DEVICE

(71) Applicant: SHIMADZU CORPORATION, Kyoto-shi, Kyoto (JP)

(72) Inventor: Toshiya Habu, Kyoto (JP)

(73) Assignee: SHIMADZU CORPORATION, Kyoto-shi, Kyoto (JP)

(*) Notice: Subject to any disclaimer, the term of this patent is extended or adjusted under 35 U.S.C. 154(b) by 0 days.

(21) Appl. No.: 14/825,325

(22) Filed: Aug. 13, 2015

(65) Prior Publication Data
US 2016/0066405 A1 Mar. 3, 2016

(30) Foreign Application Priority Data

Sep. 3, 2014 (JP) .................. 2014-178880

(51) Int. Cl.
| | | |
|---|---|---|
| *G01J 3/02* | (2006.01) | |
| *H01J 37/244* | (2006.01) | |
| *H01J 37/32* | (2006.01) | |
| *H05H 1/00* | (2006.01) | |
| *H05H 1/36* | (2006.01) | |
| *H05H 1/46* | (2006.01) | |

(52) U.S. Cl.
CPC .............. *H05H 1/46* (2013.01); *G01J 3/027* (2013.01); *H01J 37/32174* (2013.01); *H01J 37/32183* (2013.01); *H05H 1/0037* (2013.01); *H05H 1/36* (2013.01); *H05H 2001/4652* (2013.01); *H05H 2001/4682* (2013.01)

(58) Field of Classification Search
CPC .... G01J 3/027; H01J 37/244; H01J 37/32174; H01J 37/32183; H05H 1/0037; H05H 1/36
USPC ........................................................ 315/224
See application file for complete search history.

(56) References Cited

U.S. PATENT DOCUMENTS

| | | | |
|---|---|---|---|
| 6,329,757 B1 | 12/2001 | Morrisroe et al. | |
| 9,232,627 B2 * | 1/2016 | Habu | H05H 1/24 |
| 2009/0129131 A1 * | 5/2009 | Hosemans | H05H 1/30 |
| | | | 363/89 |
| 2011/0242854 A1 * | 10/2011 | Minami | H02M 1/4258 |
| | | | 363/17 |

(Continued)

FOREIGN PATENT DOCUMENTS

| | | |
|---|---|---|
| EP | 0568920 A1 | 11/1993 |
| JP | 6-20793 A | 1/1994 |

(Continued)

*Primary Examiner* — Dylan White
(74) *Attorney, Agent, or Firm* — Sughrue Mion, PLLC

(57) ABSTRACT

A high-frequency input voltage and a high-frequency input current to a series resonant circuit are detected by a voltage detection unit and a current detection unit, respectively, and plasma input power is detected by a plasma input power detection unit based on the detected high-frequency input voltage and high-frequency input current. By directly detecting the plasma input power in this manner, the plasma input power may be accurately controlled regardless of the state of a plasma-generating gas or an analysis sample. Also, use of a switching circuit including a semiconductor device allows an inexpensive configuration compared with a configuration where a vacuum tube or the like is used.

12 Claims, 3 Drawing Sheets

(56) References Cited

U.S. PATENT DOCUMENTS

| | | | |
|---|---|---|---|
| 2011/0248638 A1* | 10/2011 | Aso | H05B 33/0809 |
| | | | 315/185 R |
| 2012/0250370 A1* | 10/2012 | Taniguchi | H02M 3/33561 |
| | | | 363/34 |
| 2013/0265810 A1* | 10/2013 | Kawato | H05H 1/46 |
| | | | 363/131 |
| 2016/0066405 A1* | 3/2016 | Habu | H05H 1/46 |
| | | | 315/224 |

FOREIGN PATENT DOCUMENTS

| | | |
|---|---|---|
| JP | 10-214698 A | 8/1998 |
| JP | 2009-537829 A | 10/2009 |
| WO | 2012/039035 A1 | 3/2012 |

\* cited by examiner

HIGH-FREQUENCY POWER SUPPLY DEVICE

CROSS REFERENCE TO RELATED APPLICATIONS

This Application claims priority based on Japanese Patent Application No. 2014-178880, filed Sep. 3, 2014, the contents of which are incorporated herein by reference in their entirety.

BACKGROUND OF THE INVENTION

Field of the Invention

The present invention relates to a high-frequency power supply device for generating plasma by supplying high-frequency power to an induction coil included in a resonant circuit from a DC power supply via a switching circuit.

Description of the Related Art

For example, an analysis device such as an inductively coupled plasma (ICP) emission spectrometer has a configuration of generating plasma at a plasma torch by supplying high-frequency power to an induction coil included in a resonant circuit (for example, see JP-A-10-214698, JP-W-2009-537829, JP-A-6-20793, and WO 2012/039035 A). A high-frequency electromagnetic field is generated by the high-frequency power supplied to the induction coil, and an induced current flows by charged particles in plasma being accelerated, and plasma is thereby heated.

In the case of such a configuration, the impedance (resistance component and reactance component) of the induction coil is changed in accordance with generation of plasma. That is, the effective inductance of the induction coil is reduced due to reduction, caused by the induced current, in the magnetic field formed by the induction coil. Also, due to loss of energy caused by heating of plasma, a resistance component is caused in the induction coil. Furthermore, the impedance of the induction coil also changes due to the state of plasma changing according to the state of a plasma-generating gas or an analysis sample, the plasma input power or the like.

At the time of inputting power to plasma, the resonant circuit composed of the induction coil and a capacitor is driven at a specific oscillation frequency. The output impedance of a normal high-frequency power supply is set to 50Ω, and thus an impedance conversion circuit is arranged between the high-frequency power supply and the induction coil, and control is performed in such a way that the impedance seen from the high-frequency power supply side is 50Ω at all times. In this case, to eliminate the reflected power from the impedance conversion circuit, a method is generally adopted of driving a vacuum variable capacitor in the impedance conversion circuit by a motor or the like and adjusting the capacitance, for example.

In the case of such a configuration, the plasma input power is equal to the output power of the high-frequency power supply, and thus by calibrating the output power of the high-frequency power supply in advance by using a power meter with 50Ω, for example, the plasma input power may be accurately controlled. However, with such a configuration, to maintain the optimum state at all times by controlling the impedance conversion circuit, a complex control mechanism and expensive parts have to be used. Accordingly, these days, a method of changing the frequency according to a change in a load impedance (a so-called free running method) without using expensive parts such as a vacuum variable capacitor is being widely used.

JP-A-10-214698, JP-W-2009-537829, JP-A-6-20793, and WO 2012/039035 A disclose techniques related to a self-oscillating method as the simplest circuit configuration of the free-running type. These techniques do not limit the output impedance of the high-frequency power supply to 50Ω, and adopt a method of directly driving the resonant circuit composed of the induction coil and the capacitor. By adopting a self-oscillating method where the frequency automatically changes according to a change in the load impedance, as described above, a frequency control circuit, an impedance conversion circuit and the like may be omitted, and a simpler high-frequency power supply device may be provided.

SUMMARY OF THE INVENTION

According to the conventional configuration as described above, it is not possible to calibrate the output power of the high-frequency power supply in advance by using a power meter with 50Ω, and thus a configuration for accurately controlling the plasma input power becomes necessary.

JP-A-6-20793 proposes a configuration where a vacuum tube is used as an amplifier element. In this configuration, the resonant circuit is a parallel resonant circuit, and is capable of calculating the plasma input power from the input voltage and the input current of the parallel resonant circuit, and of performing control.

The vacuum tube is a high-voltage device, and is capable of directly driving the parallel resonant circuit of the induction coil and the capacitor. In this case, both the input voltage and the input current of the parallel resonant circuit are sine waves, and the phase difference between the input voltage and the input current is small, and thus the plasma input power may be detected as a DC component of the multiplied value of the input voltage and the input current. However, the amplifier element using a vacuum tube is poor in efficiency, and there are problems regarding the life of the vacuum tube and the increase in the cost compared with a switching circuit using a semiconductor device, or the like.

JP-A-10-214698 and JP-W-2009-537829 propose configurations where a semiconductor device is used for the amplifier element. In JP-A-10-214698, a common source switching circuit based on one or two MOSFETs is used, a choke coil is arranged on the DC power supply line of the switching circuit, and the impedance of the DC power supply line against a high-frequency wave is made high. Such a circuit may realize a highly efficient high-frequency power supply under a condition of a constant load impedance. However, as described above, with a high-frequency power supply device for generating plasma, the impedance of the induction coil changes, and thus, due to a load variation of the switching circuit, the voltage amplitude between the drain and the source of the MOSFET is changed, resulting in possible breakage due to the maximum rating of the device being exceeded.

In JP-W-2009-537829, a switching circuit is used where four MOSFETs are arranged in a bridge configuration, and an impedance conversion coil is arranged in series with a MOSFET on the high side and a MOSFET on the low side, and as in JP-A-10-214698, the voltage amplitude between the drain and the source of the MOSFET is changed due to a load variation of the switching circuit, resulting in possible breakage due to the maximum rating of the device being exceeded. Also, the induction coil and the capacitor form the parallel resonant circuit, but since a semiconductor device with a breakdown voltage lower than a vacuum tube is used, the parallel resonant circuit is driven at a frequency greatly deviated from the resonance frequency, and the impedance conversion coil is arranged between itself and the switching circuit. Thus, the phase difference between the input voltage and the input current of the parallel resonant circuit takes a value close to 90°, the DC component of the multiplied value of the input voltage and the input current becomes extremely small, and plasma input power becomes hard to detect. JP-W-2009-537829 thus proposes a configuration for controlling the plasma input power by detecting the high-frequency current of the resonant circuit. In the case of such a configuration, if the state of a plasma-generating gas, an analysis sample or the like is constant, the high-frequency power to be supplied to the induction coil may be stabilized by controlling the high-frequency current of the resonant circuit to be constant.

However, with the ICP emission spectrometer, there are cases where water is used as the solvent for an analysis sample and where an organic solvent is used. The high-frequency power to be supplied to the induction coil may be the same for when the solvent is water and when it is an organic solvent, but the impedance of the induction coil differs greatly. Accordingly, there is a problem that, even if the high-frequency current of the resonant circuit is controlled to be constant, the plasma input power changes greatly according to the state of the load, and that the plasma input power cannot be accurately controlled. In this case, the plasma is possibly turned off when switching is performed between a sample whose solvent is water and a sample whose solvent is an organic solvent.

Also, with the ICP emission spectrometer, there is a demand to analyze a sample whose matrix is unknown. However, if the matrix is different, the impedance of the induction coil is different, and thus even if the high-frequency current of the resonant circuit is controlled to be constant, the plasma input power would be changed. Accordingly, with the method of detecting the high-frequency current of the resonant circuit, there is a problem that the demand described above cannot be satisfied.

WO 2012/039035 A proposes a configuration where a switching circuit that uses a semiconductor device as an amplifier element is provided, and where the multiplied value of the input voltage and the input current of the switching circuit is controlled to be constant.

However, the plasma input power takes a value that is obtained by subtracting a loss occurring at the switching circuit from the multiplied value of the input voltage and the input current of the switching circuit. Thus, there is a problem that, even if the multiplied value of the input voltage and the input current of the switching circuit is controlled to be constant, variation may occur in the plasma input power due to a change in the efficiency of the switching circuit, for example.

On the other hand, the state of plasma changes depending on the state of a plasma-generating gas or an analysis sample, the plasma input power or the like, as described above, but a conventional high-frequency power supply device is not provided with a mechanism for monitoring the change in the state of plasma.

That is, even if the plasma input power is the same, if the state of a plasma-generating gas, an analysis sample or the like is different, the state of plasma is changed. However, since a conventional high-frequency power supply device cannot monitor the change in the state of plasma, there is a possibility that the plasma torch is melted in the case where erroneous setting is performed, for example.

Furthermore, organic solvents used by the ICP emission spectrometer include many types, such as ethanol, methyl isobutyl ketone, methanol and acetone, and a plurality of organic solvents are sometimes mixed at various ratios. If the types of organic solvents and the mixing ratio are changed, the state of plasma is also changed. However, with a conventional high-frequency power supply device, a change in the state of plasma cannot be monitored, and thus there is a problem that, if erroneous setting is performed, an error may occur in the analysis result, for example.

The present invention has been made in view of the above circumstances, and has its aim to provide a high-frequency power supply device which is capable of accurately controlling plasma input power with an inexpensive configuration. The present invention also aims to provide a high-frequency power supply device having high reliability against load variation. The present invention further aims to provide a high-frequency power supply device which is capable of easily monitoring a change in the state of plasma.

A high-frequency power supply device of the present invention includes a DC power supply, a series resonant circuit, a switching circuit, a voltage detection unit, a current detection unit and a plasma input power detection unit. The series resonant circuit includes an induction coil for plasma generation, and a capacitor. The switching circuit is a half-bridge configuration or a full-bridge configuration. The switching circuit includes a semiconductor device that switches DC power supplied from the DC power supply, and provides high-frequency power to the series resonant circuit. The voltage detection unit detects a high-frequency input voltage of the series resonant circuit. The current detection unit detects a high-frequency input current of the series resonant circuit. The plasma input power detection unit detects plasma input power based on the high-frequency input voltage and the high-frequency input current.

According to such a configuration, plasma input power may be detected based on the high-frequency input voltage and the high-frequency input current to the series resonant circuit. By directly detecting the plasma input power in this manner, the plasma input power may be accurately controlled regardless of the state of a plasma generating gas or an analysis sample. Also, use of the switching circuit including a semiconductor device allows an inexpensive configuration compared with a configuration where a vacuum tube or the like is used. Accordingly, the plasma input power may be accurately controlled with an inexpensive configuration.

Especially, since the phase difference between the high-frequency input voltage and the high-frequency input current to the series resonant circuit is made small due to the effect of the capacitor included in the series resonant circuit, the plasma input power may be more accurately detected as the DC component of a multiplied value of the input voltage and the input current.

Furthermore, because the switching circuit of a half-bridge configuration or a full-bridge configuration is used, a change in the voltage between the terminals of the semiconductor devices is small even if the load impedance is greatly changed. Breaking of the switching circuit may thus be prevented even in a case where the load impedance is changed according to turning on or off of the plasma, the state of the plasma generating gas or the analysis sample, the plasma input power or the like, and a high-frequency power supply device having high reliability against load variation may be provided.

The high-frequency power supply device may further include a voltage control unit for controlling the DC power supply in such a way that plasma input power to be detected by the plasma input power detection unit becomes constant.

According to such a configuration, by controlling the DC power supply in such a way that the plasma input power is constant, it is possible to accurately control the plasma input power. That is, compared with a configuration where the multiplied value of the input voltage and the input current of the switching circuit is controlled to be constant, plasma input power may be accurately controlled even in a case where the efficiency of the switching circuit has changed.

The high-frequency power supply device may further include an amplitude detection unit for detecting amplitude of the high-frequency input voltage or the high-frequency input current, or a frequency detection unit for detecting frequency of the high-frequency input voltage or the high-frequency input current.

According to such a configuration, by detecting the amplitude of the high-frequency input voltage or the high-frequency input current to the series resonant circuit, or the frequency of the high-frequency input voltage or the high-frequency input current to the series resonant circuit, a change in the state of plasma or the like may be monitored based on the amplitude or the frequency. Accordingly, the turning on or off of plasma, the state of a plasma generating gas or an analysis sample, an abnormal state of plasma, and especially at an ICP mass spectrometer, the positional relationship of a sampling cone and a plasma torch may be determined. Thus, in a case where a determination result is not as intended, the high-frequency power supply device may be protected by taking measures such as blocking the DC power supply.

The high-frequency power supply device may further include an impedance detection unit for detecting a value indicating an impedance of the induction coil based on the amplitude detected by the amplitude detection unit or the frequency detected by the frequency detection unit.

According to such a configuration, a value indicating the impedance of the induction coil may be detected based on the detected amplitude of the high-frequency input voltage or the high-frequency input current to the series resonant circuit, or the detected frequency of the high-frequency input voltage or the high-frequency input current to the series resonant circuit, and a change in the state of plasma may be easily monitored based on the value.

The impedance detection unit is not limited to a configuration where the value indicating the impedance of the induction coil is directly detected from the measurement value of frequency, and a configuration is also allowed where the value indicating the impedance of the induction coil is detected from the amount of change in frequency from the frequency detected before turning on of plasma. In the self-oscillating method, variation in the oscillation frequency is caused due to variation in the impedance of the induction coil. Thus, more accurate determination is enabled by detecting the frequency before turning on of plasma and taking this as a reference value, and using the amount of change in frequency from the reference value.

The high-frequency power supply device may further include an impedance determination unit for comparing a detection value of the impedance detection unit with a threshold value that is set in advance.

According to such a configuration, an abnormality may be detected based on comparison of a detected value indicating the impedance of the induction coil against a predetermined threshold value, and thus, even if an operator performs an erroneous operation or setting, occurrence of defects may be avoided.

According to the present invention, by directly detecting plasma input power, the plasma input power may be accurately controlled regardless of the state of a plasma generating gas or an analysis sample, and also use of the switching circuit including a semiconductor device allows an inexpensive configuration compared with a configuration where a vacuum tube or the like is used. Furthermore, according to the present invention, due to the use of the switching circuit of a half-bridge configuration or a full-bridge configuration, a change in the voltage between the terminals of the semiconductor devices is small even if the load impedance is greatly changed, and a high-frequency power supply device having high reliability against load variation may be provided. Still further, according to the present invention, a change in the state of plasma may be easily monitored based on the amplitude of the high-frequency input voltage or the high-frequency input current to the series resonant circuit, or the frequency of the high-frequency input voltage or the high-frequency input current to the series resonant circuit.

DETAILED DESCRIPTION OF THE PREFERRED EMBODIMENTS

Figure 1:
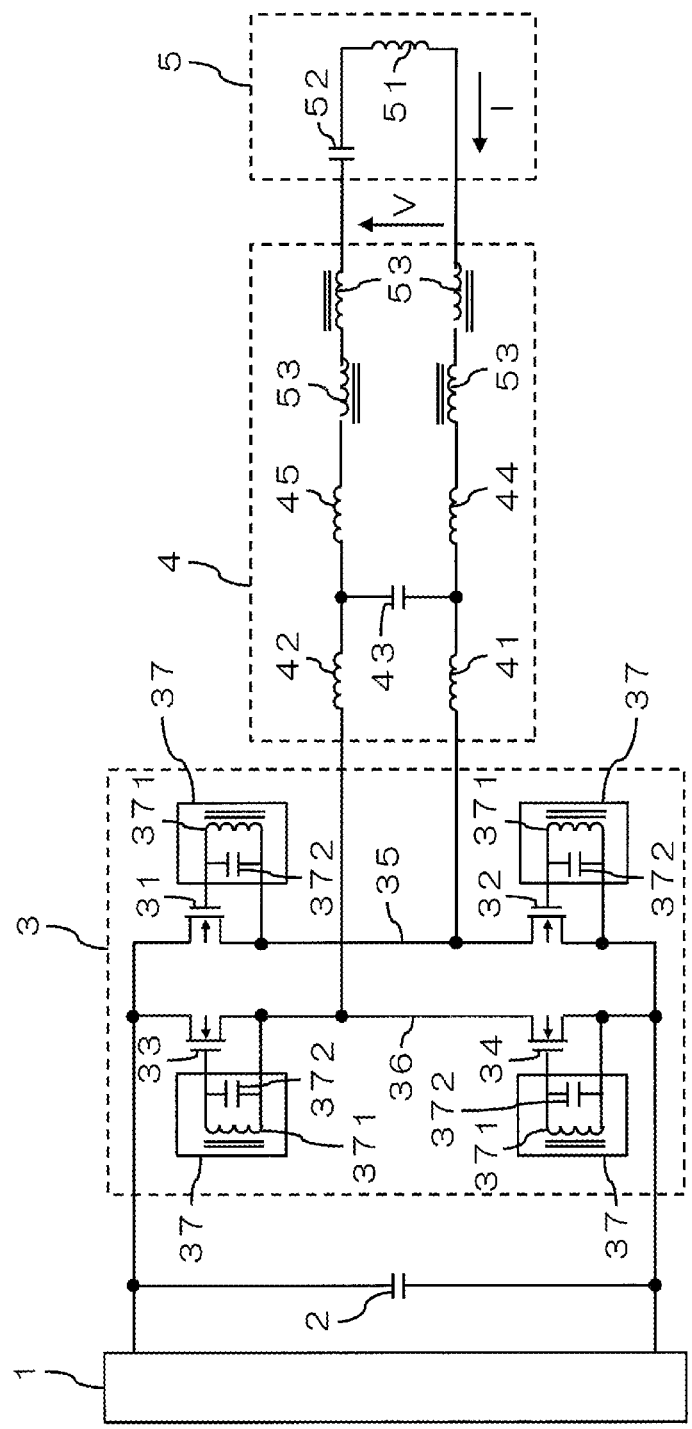
FIG. 1 is a circuit diagram showing a configuration example of a high-frequency power supply device according to an embodiment of the present invention.

FIG. 1 is a circuit diagram showing a configuration example of a high-frequency power supply device according to an embodiment of the present invention. This high-frequency power supply device may be applied to an analysis device such as an inductively coupled plasma (ICP) emission spectrometer, and is a high-frequency power supply device provided with a DC power supply 1, a bypass capacitor 2, a switching circuit 3, an impedance conversion circuit 4, a series resonant circuit 5, and the like.

The DC power supply 1 sets a DC voltage of the switching circuit 3, and determines the high-frequency power to be supplied to the series resonant circuit 5. The bypass capacitor 2 is arranged between the DC power supply 1 and the switching circuit 3, and secures a low-impedance high-frequency current path.

The series resonant circuit 5 includes an induction coil 51, and a capacitor 52 that is connected in series to the induction coil 51. The induction coil 51 included in the series resonant circuit 5 is for plasma generation, and plasma may be generated at a plasma torch (not shown) by supplying high-frequency power to the induction coil 51 from the DC power supply 1 via the switching circuit 3.

The impedance conversion circuit 4 includes four coils 41, 42, 44 and 45, and a capacitor 43. A loop including the coils 41 and 42 and the capacitor 43 of the impedance conversion circuit 4 is formed between the switching circuit 3 and the impedance conversion circuit 4. Also, a loop including the coils 44, 45 and 53, and the capacitor 43 of the impedance conversion circuit 4, and the induction coil 51 and the capacitor 52 of the series resonant circuit 5 is formed between the impedance conversion circuit 4 and the series resonant circuit 5.

The switching circuit 3 is a configuration including a semiconductor device, and is connected to the DC power supply 1 via the semiconductor device. In this example, the switching circuit 3 is configured from a bridge circuit including four MOSFETs (Metal Oxide Semiconductor Field-Effect Transistor) 31, 32, 33 and 34. The switching circuit 3 is configured from a bridge circuit of a half-bridge configuration or a full-bridge configuration. Additionally, the semiconductor device to be included in the switching circuit 3 is not limited to the MOSFET.

The DC power supply 1 and the bypass capacitor 2 are connected between the drain electrode of the MOSFET 31 and the source electrode of the MOSFET 32. Also, the source electrode of the MOSFET 31 and the drain electrode of the MOSFET 32 are connected by a wire 35, and the coil 41 of the impedance conversion circuit 4 is connected the wire 35.

The DC power supply 1 and the bypass capacitor 2 are connected between the drain electrode of the MOSFET 33 and the source electrode of the MOSFET 34. Also, the source electrode of the MOSFET 33 and the drain electrode of the MOSFET 34 are connected by a wire 36, and the coil 42 of the impedance conversion circuit 4 is connected the wire 36.

A gate drive circuit 37 is connected to the gate electrode and the source electrode of each of the MOSFETs 31, 32, 33 and 34. At the time of oscillation of the series resonant circuit 5, each of the MOSFETs 31, 32, 33 and 34 is to be switched to on state or off state at a predetermined timing via the gate drive circuit 37. DC power supplied from the DC power supply 1 may thus be switched, and be provided to the series resonant circuit 5.

A coil 371 and a capacitor 372 that are connected in parallel with each other are provided to each gate drive circuit 37. The coil 371 provided to each gate drive circuit 37 configures a secondary coil of a transformer, and is connected to the control terminals (the gate electrode and the source electrode) of the corresponding MOSFET 31, 32, 33 or 34 to turn on or off the MOSFET 31, 32, 33 or 34. A primary coil of each transformer is configured from the coil 53 included in the impedance conversion circuit 4. Each coil 53 is connected in series to the induction coil 51 and the capacitor 52. In this manner, in the present embodiment, a transformer configured from a pair of the primary coil 53 and the secondary coil 371 is provided in association with the corresponding MOSFET 31, 32, 33 or 34, and a feedback voltage may be supplied to the MOSFET 31, 32, 33 or 34.

In the present embodiment, to detect plasma input power, a voltage V and a current I at the series resonant circuit 5 are measured. The voltage V is a high-frequency input voltage to the series resonant circuit 5, and the current I is a high-frequency input current to the series resonant circuit 5. The voltage V may be measured by a capacitor voltage-dividing circuit, arranged in parallel with the series resonant circuit 5, whose combined capacitance is sufficiently small. The voltage V measured at this time is a sine wave. The current I may be measured by a circuit that is inductively coupled to a part of the series resonant circuit 5, for example.

Figure 2:
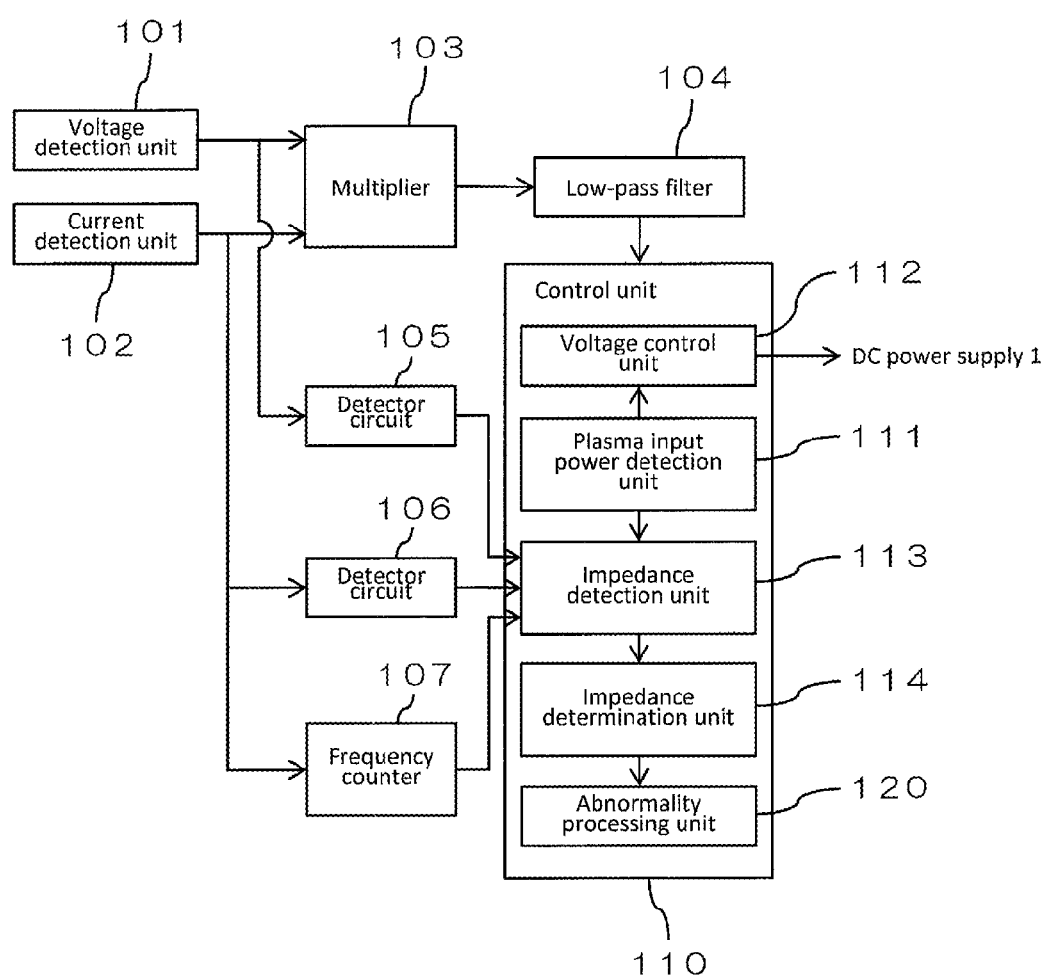
FIG. 2 is a block diagram showing a configuration example for detecting plasma input power.

FIG. 2 is a block diagram showing a configuration example for detecting plasma input power. In the present embodiment, the high-frequency input voltage (the voltage V) to the series resonant circuit 5 is detected by a voltage detection unit 101, and the high-frequency input current (the current I) to the series resonant circuit 5 is detected by a current detection unit 102, and plasma input power may be detected based on these voltage V and current I. Specifically, the plasma input power is calculated based on an output signal that is obtained by multiplying the voltage V and the current I by a multiplier 103. The output signal from the multiplier 103 is input to a control unit 110 via a low-pass filter 104.

The voltage V detected by the voltage detection unit 101 is input not only to the multiplier 103, but also to a detector circuit 105. The detector circuit 105 is a configuration including a diode and a capacitor, for example. The amplitude (the maximum value) of the voltage V is detected by the detector circuit 105, and is input to the control unit 110. The current I detected by the current detection unit 102 is input not only to the multiplier 103, but also to a detector circuit 106 and a frequency counter 107. The detector circuit 106 is a configuration including a diode and a capacitor, for example. The amplitude (the maximum value) of the current I is detected by the detector circuit 106, and is input to the control unit 110. Also, the frequency is counted by the frequency counter 107 based on the current I, and is input to the control unit 110.

However, the frequency counter 107 is not limited to a configuration for counting the frequency based on the current I, and it may alternatively be a configuration for counting the frequency based on the voltage V, for example. In this case, a configuration may be adopted where the voltage V is input to the frequency counter 107 instead of the configuration where the current I is input to the frequency counter 107.

As described above, the frequency counter 107 configures a frequency detection unit for detecting the frequency of the high-frequency input voltage (the voltage V) or the high-frequency input current (the current I) to the series resonant circuit 5. Providing a frequency detection unit such as the frequency counter 107 enables the frequency of the series resonant circuit 5 to be detected with ease.

The control unit 110 is a configuration including a CPU (Central Processing Unit) or an FPGA (Field Programmable Gate Array), for example, and by executing programs, functions as various functional units such as a plasma input power detection unit 111, a voltage control unit 112, an impedance detection unit 113, an impedance determination unit 114, an abnormality processing unit 120, and the like.

The plasma input power detection unit 111 detects plasma input power based on the voltage V and the current I. Specifically, a value obtained by multiplying a predetermined factor according to gain or the like with an output value that is obtained from the voltage V and the current I through the multiplier 103 and the low-pass filter 104 may be detected as plasma input power, based on the output value being proportionate to the plasma input power.

That is, in the present embodiment, the high-frequency input voltage (the voltage V) and the high-frequency input current (the current I) to the series resonant circuit 5 are detected by the voltage detection unit 101 and the current detection unit 102, respectively, and plasma input power may be detected based on the detected high-frequency input voltage and high-frequency input current. By directly detecting the plasma input power in this manner, the plasma input power may be accurately controlled regardless of the state of a plasma-generating gas, an analysis sample or the like. Also, use of the switching circuit 3 including a semiconductor device allows an inexpensive configuration compared with a configuration where a vacuum tube or the like is used. Accordingly, plasma input power may be accurately controlled by an inexpensive configuration.

Especially, since the phase difference between the high-frequency input voltage and the high-frequency input current to the series resonant circuit 5 is made small due to the effect of the capacitor 52 included in the series resonant circuit 5, plasma input power may be more accurately detected as the DC component of a multiplied value of the input voltage and the input current.

Furthermore, because the switching circuit 3 of a half-bridge configuration or a full-bridge configuration is used, changes in the voltages between the drains and the sources of the MOSFETs 31, 32, 33 and 34 are small even if the load impedance is greatly changed. Breaking of the switching circuit 3 may thus be prevented even in a case where the load impedance is changed according to turning on or off of the plasma, the state of the plasma-generating gas or the analysis sample, the plasma input power or the like, and a high-frequency power supply device having high reliability against load variation may be provided.

The voltage control unit 112 controls the DC power supply 1 in such a way that the plasma input power to be detected by the plasma input power detection unit 111 becomes constant. More specifically, voltage control by the voltage control unit 112 is performed after plasma generation. For example, the voltage of the DC power supply 1 or the amplitude of the high-frequency input voltage or the high-frequency input current to the series resonant circuit 5 is controlled, before plasma generation, to be constant, and plasma input power is controlled to be constant by the control mode being switched, after plasma generation, to voltage control by the voltage control unit 112. At this time, the voltage of the DC power supply 1 or the amplitude of the high-frequency input voltage or the high-frequency input current to the series resonant circuit 5 is desirably set to a value according to which the amount of change before and after the switching of the control mode is small.

In this manner, by controlling the DC power supply 1 in such a way that the plasma input power is constant after plasma generation, it is possible to accurately control the plasma input power. That is, compared with a configuration where the multiplied value of the input voltage and the input current of the switching circuit 3 is controlled to be constant, plasma input power may be accurately controlled even in a case where the efficiency of the switching circuit 3 has changed.

In the present embodiment, the detector circuits 105 and 106 configure an amplitude detection unit for detecting the amplitude of the high-frequency input voltage (the voltage V) or the high-frequency input current (the current I) to the series resonant circuit 5. Accordingly, by detecting the amplitude of the high-frequency input voltage or the high-frequency input current to the series resonant circuit 5, a change in the state of plasma or the like may be monitored based on the amplitude. Also, by detecting the frequency of the high-frequency input voltage (the voltage V) or the high-frequency input current (the current I) to the series resonant circuit 5 by using a frequency detection unit such as the frequency counter 107, the change in the state of plasma or the like may be monitored based on the frequency.

Accordingly, the turning on or off of plasma, the state of a plasma-generating gas or an analysis sample, an abnormal state of plasma, and especially at an ICP mass spectrometer, the positional relationship of a sampling cone and a plasma torch may be determined. Thus, in a case where a determination result is not as intended, the high-frequency power supply device may be protected by taking measures such as blocking the DC power supply 1.

The impedance detection unit 113 detects a value indicating an impedance Z of the induction coil 51 based on the amplitudes of the high-frequency input voltage and the high-frequency input current to the series resonant circuit 5 detected by the detector circuits 105 and 106. Here, a value indicating an impedance Z of the induction coil 51 is not limited to the value itself of the impedance Z, and is a concept including a value that changes according to the impedance Z.

In a state where the plasma input power is controlled to be constant, the value indicating the impedance Z of the induction coil 51 also changes according to a change in the amplitudes of the high-frequency input voltage and the high-frequency input current to the series resonant circuit 5. Accordingly, it is possible to detect the value indicating the impedance Z of the induction coil 51 based on the amplitudes (including the amounts of change in the amplitudes) of the high-frequency input voltage and the high-frequency input current to the series resonant circuit 5. As in the present embodiment, with a configuration where the amplitudes of both the high-frequency input voltage and the high-frequency input current to the series resonant circuit 5 are to be detected, the value indicating the impedance may be more accurately detected. However, a configuration is also possible where the value indicating the impedance Z of the induction coil 51 is detected based on the amplitude (including the amount of change in the amplitude) of the high-frequency input voltage or the high-frequency input current to the series resonant circuit 5 by having one of the detector circuits 105 and 106 omitted.

In the same manner, in a state where the plasma input power is controlled to be constant, the value indicating the impedance Z of the induction coil 51 changes according to a change in the frequency of the high-frequency input voltage or the high-frequency input current to the series resonant circuit 5. Accordingly, it is also possible to detect the value indicating the impedance Z of the induction coil 51 based on the frequency (including the amount of change in the frequency) of the high-frequency input voltage or the high-frequency input current to the series resonant circuit 5.

In this manner, according to the present embodiment, a value indicating the impedance of the induction coil 51 may be detected based on the detected amplitude of the high-frequency input voltage or the high-frequency input current to the series resonant circuit 5, or the detected frequency of the high-frequency input voltage or the high-frequency input current to the series resonant circuit 5, and a change in the state of plasma may be easily monitored based on the value.

However, the impedance detection unit 113 is not limited to a configuration where the value indicating the impedance Z of the induction coil 51 is directly detected from the measurement value of frequency, and a configuration is also allowed where the value indicating the impedance Z of the induction coil 51 is detected from the amount of change in frequency based on the frequency detected before turning on of plasma. In the self-oscillating method, variation in the oscillation frequency is caused due to variation in the induction coil 51. Thus, more accurate determination is enabled by detecting the frequency before turning on of plasma and taking this as a reference value, and using the amount of change in frequency from the reference value.

The impedance determination unit 114 compares the detection value of the impedance detection unit 113, that is, the value indicating the impedance Z of the induction coil 51, with a threshold value that is set in advance. An abnormality may thereby be detected in a case where the value indicating the impedance Z is an unexpected value, for example. The determination result of the impedance determination unit 114 is input to the abnormality processing unit 120.

The abnormality processing unit 120 performs abnormality processing based on the determination result of the impedance determination unit 114. For example, in a case where an operator performs an erroneous operation or setting, a notification of the abnormality is issued based on the determination result of the impedance determination unit 114 to avoid occurrence of a defect. Also, for example, in a case where the high-frequency power supply device operates in an unexpected manner, spreading of defects may be prevented by blocking the output of the DC power supply 1 and turning off the plasma.

Figure 3:
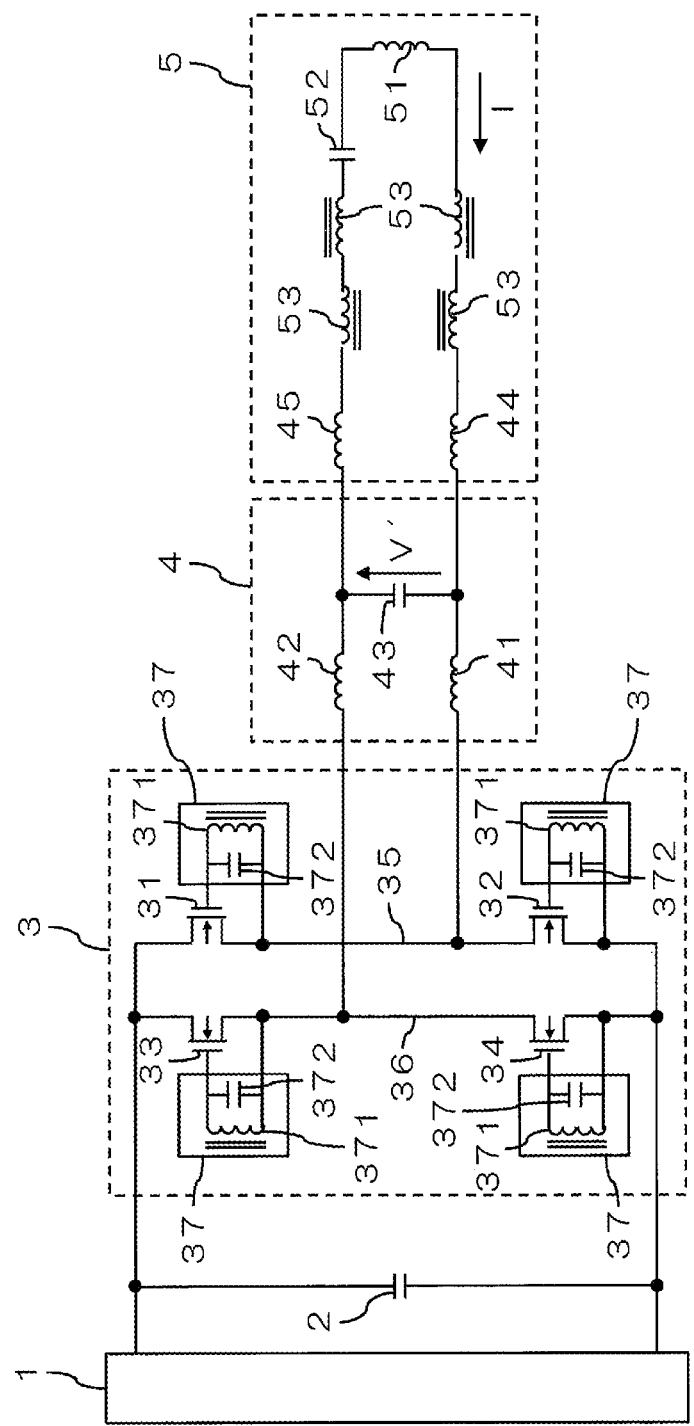
FIG. 3 is a circuit diagram showing a modification example of the high-frequency power supply device.

FIG. 3 is a circuit diagram showing a modification example of the high-frequency power supply device. In this modification example, the configurations of the DC power supply 1, the bypass capacitor 2, the switching circuit 3 and the like are the same as those in the embodiment described above, but the configurations of the impedance conversion circuit 4 and the series resonant circuit 5 are different from the embodiment described above. Specifically, the coils 44, 45 and 53 are included not in the impedance conversion circuit 4, but in the series resonant circuit 5.

In this modification example, to detect plasma input power, a voltage V' at both ends of the capacitor 43 of the impedance conversion circuit 4, and a current I at the series resonant circuit 5 are measured. The voltage V' is a high-frequency input voltage to the series resonant circuit 5, and the current I is a high-frequency input current to the series resonant circuit 5. The voltage V' may be measured by a capacitor voltage-dividing circuit that is arranged in parallel with the capacitor 43, for example. In this case, the combined capacitance of the capacitor voltage-dividing circuit may be made a part of the capacitor 43, and the combined capacitance does not have to be made sufficiently small. The current I may be measured by a circuit that is inductively coupled to a part of the series resonant circuit 5, for example. Here, the current I is a sine wave, but since a harmonic current flows into the capacitor 43 of the impedance conversion circuit 4 from the switching circuit 3, many harmonics are included in the voltage V', and the voltage V' does not become a sine wave. However, since the current I is a sine wave, the DC component of the multiplication result of the voltage V' and the current I does not show the harmonic components of the voltage V', and matches the plasma input power.

In the embodiment described above, the configurations of the switching circuit 3, the impedance conversion circuit 4, and the series resonant circuit 5 are concretely described with reference to FIG. 1, but these configurations are not restrictive, and various other configurations may be applied to at least one of the switching circuit 3, the impedance conversion circuit 4, and the series resonant circuit 5.

Also, in the embodiment described above, a configuration is described where the high-frequency input voltage (the voltage V) and the high-frequency input current (the current I) to the series resonant circuit 5 are detected by the voltage detection unit 101 and the current detection unit 102, respectively, but a configuration where fundamental wave components of the voltage V and the current I are extracted by filters, for example, and plasma input power is detected based on these fundamental wave components is also possible.

In this case, a configuration is possible where the fundamental wave components of the voltage V and the current I extracted by the filters are input to the multiplier 103 after having the phase difference between the fundamental wave components adjusted by a phase difference adjustment mechanism. The phase difference adjustment mechanism enables manual adjustment of the phase difference between the fundamental wave components, for example, and variations in parts may be corrected by performing adjustment in advance at the time of shipping of the high-frequency power supply device. Occurrence of a phase difference between the fundamental wave components of the voltage V and the current I due to variations in parts or the like may thus be prevented, and the accuracy of the detection value of plasma input power may be increased.

The high-frequency power supply device according to the present invention may also be applied to other analysis devices that perform analysis by using plasma, in addition to the ICP emission spectrometer. Moreover, the high-frequency power supply device according to the present invention may also be applied to various other devices that use plasma (for example, a high-frequency oscillation circuit for plasma CVD or the like), without being limited to analysis devices.

What is claimed is:

1. A high-frequency power supply device comprising:
a DC power supply;
a series resonant circuit including an induction coil configured for plasma generation via inductance by the induction coil, and a capacitor;
a switching circuit of a half-bridge configuration or a full-bridge configuration, the switching circuit including a semiconductor device that switches DC power supplied from the DC power supply, and provides high-frequency power to the series resonant circuit;
a voltage detection unit configured to detect a high-frequency input voltage of the series resonant circuit;
a current detection unit configured to detect a high-frequency input current of the series resonant circuit; and
a plasma input power detection unit configured to detect plasma input power based on a value of the high-frequency input voltage and the high-frequency input current detected by the voltage detection unit and the current detection unit, respectively.

2. The high-frequency power supply device according to claim 1, further comprising
a voltage control unit configured to control the DC power supply in such a way that plasma input power to be detected by the plasma input power detection unit becomes constant.

3. The high-frequency power supply device according to claim 1, further comprising
a frequency detection unit configured to detect frequency of the high-frequency input voltage or the high-frequency input current.

4. The high-frequency power supply device according to claim 3, further comprising
an impedance detection unit configured to detect a value indicating an impedance of the induction coil based on the frequency detected by the frequency detection unit.

5. The high-frequency power supply device according to claim 4, further comprising
an impedance determination unit configured to compare a detection value of the impedance detection unit with a threshold value that is set in advance.

6. The high-frequency power supply device according to claim 1, further comprising
an amplitude detection unit configured to detect an amplitude of the high-frequency input voltage or the high-frequency input current.

7. The high-frequency power supply device according to claim 6, further comprising
an impedance detection unit configured to detect a value indicating an impedance of the induction coil based on the amplitude detected by the amplitude detection unit.

8. The high-frequency power supply device according to claim 7, further comprising
an impedance determination unit configured to compare a detection value of the impedance detection unit with a threshold value that is set in advance.

9. The high-frequency power supply device according to claim 1, wherein the voltage detection unit is adjacently connected to the series resonant circuit.

10. The high-frequency power supply device according to claim 9, wherein the current detection unit is adjacently connected to the series resonant circuit.

11. The high-frequency power supply device according to claim 1, further comprising
a multiplier configured to multiply the high-frequency input voltage and the high-frequency input current detected by the voltage detection unit and the current detection unit, respectively, wherein
the plasma input power detection unit is configured to detect plasma input power based on an output signal from the multiplier.

12. A high-frequency power supply device comprising:
a DC power supply;
a series resonant circuit including an induction coil for plasma generation, and a capacitor;
a switching circuit of a half-bridge configuration or a full-bridge configuration, the switching circuit including a semiconductor device that switches DC power supplied from the DC power supply, and provides high-frequency power to the series resonant circuit;
a voltage detection unit configured to detect a high-frequency input voltage of the series resonant circuit;
a current detection unit configured to detect a high-frequency input current of the series resonant circuit;
a plasma input power detection unit configured to detect plasma input power based on the high-frequency input voltage and the high-frequency input current;
an amplitude detection unit configured to detect amplitude of the high-frequency input voltage or the high-frequency input current, or a frequency detection unit configured to detect frequency of the high-frequency input voltage or the high-frequency input current;
an impedance detection unit configured to detect a value indicating an impedance of the induction coil based on the amplitude detected by the amplitude detection unit or the frequency detected by the frequency detection unit; and
an impedance determination unit configured to compare a detection value of the impedance detection unit with a threshold value that is set in advance.

* * * * *